(12) United States Patent
Albert et al.

(10) Patent No.: US 6,172,798 B1
(45) Date of Patent: Jan. 9, 2001

(54) SHUTTER MODE MICROENCAPSULATED ELECTROPHORETIC DISPLAY

(75) Inventors: Jonathan D. Albert; Barrett Comiskey, both of Cambridge, MA (US)

(73) Assignee: E Ink Corporation, Cambridge, MA (US)

(*) Notice: Under 35 U.S.C. 154(b), the term of this patent shall be extended for 0 days.

(21) Appl. No.: 09/571,631

(22) Filed: May 15, 2000

Related U.S. Application Data (63) Continuation of application No. 09/300,585, filed on Apr. 27, 1999
(60) Provisional application No. 60/083,252, filed on Apr. 27, 1998.

(51) Int. Cl.[7] .............................. G02B 26/00; G09G 3/34; B29C 39/10; G03G 17/04
(52) U.S. Cl. .............................. 359/296; 345/107; 264/4; 430/32
(58) Field of Search .................................. 359/263, 277, 359/296; 345/107; 349/86; 264/4; 430/32, 34, 35

(56) References Cited

U.S. PATENT DOCUMENTS 5,961,804 * 10/1999 Jacobson et al. ............ 204/606
6,017,584 * 1/2000 Albert et al. ................ 427/213.3

FOREIGN PATENT DOCUMENTS

WO 99/56171A1 * 11/1999 (WO) .............. G02F/1/167

* cited by examiner

Primary Examiner—Georgia Epps
Assistant Examiner—David N. Spector
(74) Attorney, Agent, or Firm—Testa, Hurwitz & Thibeault, LLP (57) ABSTRACT

An electrophoretic display element includes a capsule having a first, larger surface and a second, smaller surface. The capsule contains a suspending fluid and at least one particle dispersed within said suspending fluid. Application of a first electrical field causes the particle or particles to migrate towards the first, larger surface of the capsule, causing it to take on the visual appearance of the particles. Application of a second electrical field causes the particle or particles to migrate towards the second, smaller surface, allowing the capsule to take on the visual appearance of the dispersing fluid or of a substrate or electrode positioned behind the display element. Displays may be fabricated from multiple display elements arranged on a substrate.

7 Claims, 9 Drawing Sheets

SHUTTER MODE MICROENCAPSULATED ELECTROPHORETIC DISPLAY

CROSS-REFERENCE TO RELATED APPLICATIONS

This application is a continuation of U.S. Ser. No. 09/300,585, filed Apr. 27, 1999, and claims priority to U.S. Ser. No. 60/083,252 filed Apr. 27, 1998, the contents of which is incorporated herein by reference.

FIELD OF THE IMVENTION

The present invention relates to encapsulated electrophoretic displays and, in particular, to shutter mode encapsulated electrophoretic displays.

BACKGROUND OF THE INVENTION

Traditionally, electronic displays such as liquid crystal displays have been made by sandwiching an optoelectrically active material between two pieces of glass. In many cases each piece of glass has an etched, clear electrode structure formed using indium tin oxide. A first electrode structure controls all the segments of the display that may be addressed, that is, changed from one visual state to another. A second electrode, sometimes called a counter electrode, addresses all display segments as one large electrode, and is generally designed not to overlap any of the rear electrode wire connections that are not desired in the final image. Alternatively, the second electrode is also patterned to control specific segments of the display. In these displays, unaddressed areas of the display have a defined appearance.

Electrophoretic display media, generally characterized by the movement of particles through an applied electric field, are highly reflective, can be made bistable, and consume very little power. Encapsulated electrophoretic displays also enable the display to be printed. These properties allow encapsulated electrophoretic display media to be used in many applications for which traditional electronic displays are not suitable, such as flexible displays. The electro-optical properties of encapsulated displays allow, and in some cases require, novel schemes or configurations to be used to address the displays.

"Shutter mode" electrophoretic displays are configured so that the particles can switch between a largely light-blocking (or reflecting) state and a largely light-transmitting state. These displays often are constructed with particles which can migrate between a smaller and larger electrode. Migration of the particles to the large electrodes allows them to spread out, causing the capsule to take on the visual properties of the particles. Migration of the particles to the smaller electrode causes the capsule to take on the visual properties of the dispersing fluid or of the larger electrode, because the particles are "clumped" together near the smaller electrode. Another use of this effect is to control transmission of light through the capsule. The drawback to shutter mode displays is that the electrodes must be etched very precisely.

SUMMARY OF THE INVENTION

An object of the invention is to provide a highly-flexible, reflective display which can be manufactured easily, consumes little (or none in the case of bistable displays) power, and can, therefore, be incorporated into a variety of applications. The invention features a printable display comprising an encapsulated electrophoretic display medium. The resulting display may be flexible. Since the display media can be printed, the display itself can be made inexpensively. In particular, the present invention allows shutter mode electrophoretic displays to be fabricated without requiring finely etched electrodes.

An encapsulated electrophoretic display can be constructed so that the optical state of the display is stable for some length of time. When the display has two states which are stable in this manner, the display is said to be bistable. If more than two states of the display are stable, then the display can be said to be multistable. For the purpose of this invention, the term bistable will be used to indicate a display in which any optical state remains fixed once the addressing voltage is removed. The definition of a bistable state depends on the application for the display. A slowly-decaying optical state can be effectively bistable if the optical state is substantially unchanged over the required viewing time. For example, in a display which is updated every few minutes, a display image which is stable for hours or days is effectively bistable for that application. In this invention, the term bistable also indicates a display with an optical state sufficiently long-lived as to be effectively bistable for the application in mind. Alternatively, it is possible to construct encapsulated electrophoretic displays in which the image decays quickly once the addressing voltage to the display is removed (i.e., the display is not bistable or multistable). As will be described, in some applications it is advantageous to use an encapsulated electrophoretic display which is not bistable. Whether or not an encapsulated electrophoretic display is bistable, and its degree of bistability, can be controlled through appropriate chemical modification of the electrophoretic particles, the suspending fluid, the capsule, and binder materials.

An encapsulated electrophoretic display may take many forms. The display may comprise capsules or liquid drops dispersed in a binder. The capsules may be of any size or shape. The capsules may, for example, be spherical and may have diameters in the millimeter range or the micron range, but is preferably from ten to a few hundred microns. The capsules may be formed by an encapsulation technique, as described below. Particles may be encapsulated in the capsules. The particles may be one or more different types of particles. The particles may be colored, luminescent, light-absorbing or transparent, for example. The particles may include neat pigments, dyed (laked) pigments or pigment/polymer composites, for example. The display may further comprise a suspending fluid in which the particles are dispersed.

The successful construction of an encapsulated electrophoretic display requires the proper interaction of several different types of materials and processes, such as a polymeric binder and, optionally, a capsule membrane. These materials must be chemically compatible with the electrophoretic particles and fluid, as well as with each other. The capsule materials may engage in useful surface interactions with the electrophoretic particles, or may act as a chemical or physical boundary between the fluid and the binder.

In some cases, the encapsulation step of the process is not necessary, and the electrophoretic fluid may be directly dispersed or emulsified into the binder (or a precursor to the binder materials) and an effective "polymer-dispersed electrophoretic display" constructed. In such displays, voids created in the binder may be referred to as capsules or microcapsules even though no capsule membrane is present. The binder dispersed electrophoretic display may be of the emulsion or phase separation type.

Throughout the specification, reference will be made to printing or printed. As used throughout the specification, printing is intended to include all forms of printing and coating, including: premetered coatings such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; and other similar techniques. A "printed element" refers to an element formed using any one of the above techniques.

This invention provides novel methods and apparatus for controlling and addressing particle-based displays. Additionally, the invention discloses applications of these methods and materials on flexible substrates, which are useful in large-area, low cost, or high-durability applications.

In one aspect, the invention relates to an encapsulated electrophoretic display element which includes a capsule having a first, larger surface and a second, smaller surface and containing a suspending fluid and at least one particle. When a first electrical field is applied to the capsule, at least some of the particles migrate toward the first, larger surface. When a second electrical field is applied to the capsule, at least some of the particles migrate towards the second, smaller surface. The invention features a display element which can be placed in a condition where the display is transparent, or, depending on the characteristics of the particles, substantially opaque or substantially reflective.

In another aspect, the invention relates to an electrophoretic display which includes a plurality of display elements where each element includes a capsule having a first, larger surface and a second, smaller surface and containing a suspending fluid and at least one particle dispersed within the suspending fluid. The display also includes a first substrate defining a plurality of cavities, each cavity adapted to receive one of the plurality of display elements therein. The invention features a patterned first substrate, where the cavities can be created by embossing, by etching, or by engraving, and also features a second substrate that can be disposed over the first substrate to enclose the cavities. The invention features cavities within the first substrate that can be conical, pyramidal, or groove-shaped. The grooves can have cross-sections that are triangular or trapezoidal, or the grooves may have parallel walls.

In still another aspect, the invention relates to a method of manufacturing an electrophoretic display element including the steps of: encapsulating within a capsule a suspending fluid having a first optical property, at least one particle having a second optical property different from said first optical property, and a structural material; orienting the capsule in a predetermined orientation; and treating the structural material to form a structural portion within the capsule that creates a display portion of the capsule having a first, larger surface and a second, smaller surface. Application of a first electrical field causes the at least one particle to migrate towards said first, larger surface. Application of a second electrical field causes the at least one particle to migrate towards said second, smaller surface. The invention features steps to process the structural material within the capsule including polymerizing the material, photohardening the material, thermally treating the material, or melting and solidifying the material.

In yet another aspect, the invention relates to a method of manufacturing an electrophoretic display element including the steps of: encapsulating within a capsule a suspending fluid having a first optical property and at least one particle dispersed within said suspending fluid and having a second optical property different from the first optical property; and shaping the capsule to produce a first, larger surface and a second, smaller surface. Application of a first electrical field causes the at least one particle to migrate towards the first, larger surface. Application of a second electrical field causes the at least one particle to migrate towards the second, smaller surface. The invention also features the additional step of providing electrodes which can address the display element.

In another aspect, the invention relates to an electrophoretic display element includes a capsule having a first surface and a second surface. The display element also contains a structural portion adjacent to at least a portion of the second surface of the capsule to create a display portion wherein the capsule, the display portion including a suspending fluid and at least one particle dispersed within said suspending fluid and having a first, larger surface and a second smaller surface. The invention features a display element which can be placed in a condition where the display is transparent, or, depending on the characteristics of the particles, substantially opaque or substantially reflective. The invention also features a structural portion which can be a polymer, including a thermoset polymer or a photohardenable polymer.

In still another aspect, the invention relates to an electrophoretic display comprising a plurality of display elements, each display element including a capsule having a first surface and a second surface. The display element also contains a structural portion adjacent to at least a portion of the second surface of the capsule to create a display portion within the capsule, the display portion including a suspending fluid and at least one particle dispersed within the suspending fluid and having a first, larger surface and a second smaller surface. The display also includes a first substrate defining a plurality of cavities, each cavity adapted to receive one of the plurality of display elements therein. The invention also features display elements which are individually addressable, and a substrate having cavities which can be conical or pyramidal.

In another aspect, the invention relates to a method of manufacturing an electrophoretic display comprising the steps of manufacturing a plurality of display elements, by encapsulating a suspending fluid having a first optical property and at least one particle having a second optical property different from said first optical property and shaping said capsule to produce a first, larger surface and a second, smaller surface. A substrate is provided defining a plurality of cavities, each cavity adapted to receive one of the plurality of display elements, and at least one of display element is situated within at least one of the cavities defined by the substrate. The invention additionally features the steps of providing electrodes adapted to address each display element individually, and providing a substrate which has depressions that define conical cavities, pyramidal cavities, or grooves.

In yet another aspect, the invention relates to a method of manufacturing an electrophoretic display comprising the steps of manufacturing a plurality of display elements. Each display element is manufactured by encapsulating a suspending fluid having a first optical property, at least one particle having a second optical property different from said first optical property, and a structural material. A substrate defines a plurality of cavities and each cavity is adapted to receive a display element. At least one display element is situated within at least one of the cavities defined by the substrate. The substrate is oriented in a predetermined orientation and the structural material is treated to form a display portion within each capsule. The display portion has a first, larger surface and a second smaller surface. The invention also features the steps of providing electrodes adapted to address each display element individually, and providing a substrate which has depressions that define conical cavities, pyramidal cavities, or grooves.

In another aspect, the invention relates to an encapsulated electrophoretic display element which includes a capsule having a first surface and a second surface, wherein the first surface and the second surface comprise different projected areas when viewed in the intended viewing direction. The capsule contains a suspending fluid and at least one particle. When a first electrical field is applied to the capsule, at least some of the particles migrate toward the first surface. When a second electrical field is applied to the capsule, at least some of the particles migrate towards the second surface.

BRIEF DESCRIPTION OF THE DRAWINGS

The invention is pointed out with particularity in the appended claims. The advantages of the invention described above, together with further advantages, may be better understood by referring to the following description taken in conjunction with the accompanying drawings. In the drawings, like reference characters generally refer to the same parts throughout the different views. Also, the drawings are not necessarily to scale, emphasis instead generally being placed upon illustrating the principles of the invention.

DETAILED DESCRIPTION OF THE INVENTION

An electronic ink is an optoelectronically active material which comprises at least two phases: an electrophoretic contrast media phase and a coating/binding phase. The electrophoretic phase comprises, in some embodiments, a single species of electrophoretic particles dispersed in a clear or dyed medium, or more than one species of electrophoretic particles having distinct physical and electrical characteristics dispersed in a clear or dyed medium. In some embodiments the electrophoretic phase is encapsulated, that is, there is a capsule wall phase between the two phases. The coating/binding phase includes, in one embodiment, a polymer matrix that surrounds the electrophoretic phase. In this embodiment, the polymer in the polymeric binder is capable of being dried, crosslinked, or otherwise cured as in traditional inks, and therefore a printing process can be used to deposit the electronic ink onto a substrate. An electronic ink is capable of being printed by several different processes, depending on the mechanical properties of the specific ink employed. For example, the fragility or viscosity of a particular ink may result in a different process selection. A very viscous ink would not be well-suited to deposition by an inkjet printing process, while a fragile ink might not be used in a knife over roll coating process.

The optical quality of an electronic ink is quite distinct from other electronic display materials. The most notable difference is that the electronic ink provides a high degree of both reflectance and contrast because it is pigment based (as are ordinary printing inks). The light scattered from the electronic ink comes from a very thin layer of pigment close to the top of the viewing surface. In this respect it resembles an ordinary, printed image. Also, electronic ink is easily viewed from a wide range of viewing angles in the same manner as a printed page, and such ink approximates a Lambertian contrast curve more closely than any other electronic display material. Since electronic ink can be printed, it can be included on the same surface with any other printed material, including traditional inks. Electronic ink can be made optically stable in all display configurations, that is, the ink can be set to a persistent optical state. Fabrication of a display by printing an electronic ink is particularly useful in low power applications because of this stability.

Electronic ink displays are novel in that they can be addressed by DC voltages and draw very little current. As such, the conductive leads and electrodes used to deliver the voltage to electronic ink displays can be of relatively high resistivity. The ability to use resistive conductors substantially widens the number and type of materials that can be used as conductors in electronic ink displays. In particular, the use of costly vacuum-sputtered indium tin oxide (ITO) conductors, a standard material in liquid crystal devices, is not required. Aside from cost savings, the replacement of ITO with other materials can provide benefits in appearance, processing capabilities (printed conductors), flexibility, and durability. Additionally, the printed electrodes are in contact only with a solid binder, not with a fluid layer (like liquid crystals). This means that some conductive materials, which would otherwise dissolve or be degraded by contact with liquid crystals, can be used in an electronic ink application. These include opaque metallic inks for the rear electrode (e.g., silver and graphite inks), as well as conductive transparent inks for either substrate. These conductive coatings include semiconducting colloids, examples of which are indium tin oxide and antimony-doped tin oxide. Organic conductors (polymeric conductors and molecular organic conductors) also may be used. Polymers include, but are not limited to, polyaniline and derivatives, polythiophene and derivatives, poly3,4-ethylenedioxythiophene (PEDOT) and derivatives, polypyrrole and derivatives, and polyphenylenevinylene (PPV) and derivatives. Organic molecular conductors include, but are not limited to, derivatives of naphthalene, phthalocyanine, and pentacene. Polymer layers can be made thinner and more transparent than with traditional displays because conductivity requirements are not as stringent.

As an example, there are a class of materials called electroconductive powders which are also useful as coatable transparent conductors in electronic ink displays. One example is Zelec ECP electroconductive powders from DuPont Chemical Co. of Wilmington, Del.

Figure 1A:
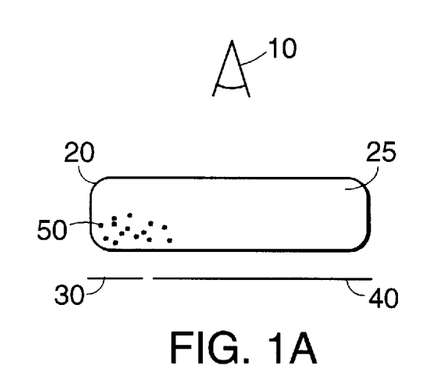
FIG. 1A is a diagrammatic side view of an embodiment of a rear-addressing electrode structure for a particle-based display in which the smaller electrode has been placed at a voltage relative to the large electrode causing the particles to migrate to the smaller electrode.
Figure 1B:
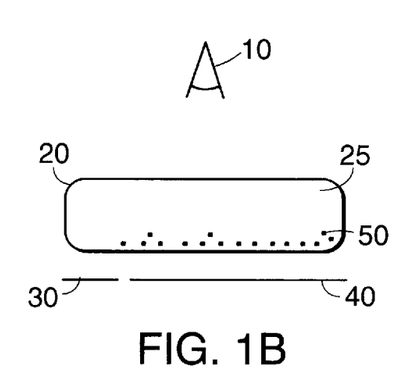
FIG. 1B is a diagrammatic side view of an embodiment of a rear-addressing electrode structure for a particle-based display in which the larger electrode has been placed at a voltage relative to the smaller electrode causing the particles to migrate to the larger electrode.

Referring now to FIGS. 1A and 1B, an addressing scheme for controlling particle-based displays is shown in which electrodes are disposed on only one side of a display, allowing the display to be rear-addressed. Utilizing only one side of the display for electrodes simplifies fabrication of displays. For example, if the electrodes are disposed on only the rear side of a display, both of the electrodes can be fabricated using opaque materials, because the electrodes do not need to be transparent.

FIG. 1A depicts a single capsule 20 of an encapsulated display media. In brief overview, the embodiment depicted in FIG. 1A includes a capsule 20 containing at least one particle 50 dispersed in a suspending fluid 25. The capsule 20 is addressed by a first electrode 30 and a second electrode 40. The first electrode 30 is smaller than the second electrode 40. The first electrode 30 and the second electrode 40 may be set to voltage potentials which affect the position of the particles 50 in the capsule 20.

The particles 50 represent 0.1% to 20% of the volume enclosed by the capsule 20. In some embodiments the particles 50 represent 2.5% to 17.5% of the volume enclosed by capsule 20. In preferred embodiments, the particles 50 represent 5% to 15% of the volume enclosed by the capsule 20. In more preferred embodiments the particles 50 represent 9% to 11% of the volume defined by the capsule 20. In general, the volume percentage of the capsule 20 that the particles 50 represent should be selected so that the particles 50 expose most of the second, larger electrode 40 when positioned over the first, smaller electrode 30. As described in detail below, the particles 50 may be colored any one of a number of colors. The particles 50 may be either positively charged or negatively charged.

The particles 50 are dispersed in a dispersing fluid 25. The dispersing fluid 25 should have a low dielectric constant. The fluid 25 may be clear, or substantially clear, so that the fluid 25 does not inhibit viewing the particles 50 and the electrodes 30, 40 from position 10. In other embodiments, the fluid 25 is dyed. In some embodiments the dispersing fluid 25 has a specific gravity matched to the density of the particles 50. These embodiments can provide a bistable display media, because the particles 50 do not tend to move in certain compositions absent an electric field applied via the electrodes 30, 40.

Figure 1C:
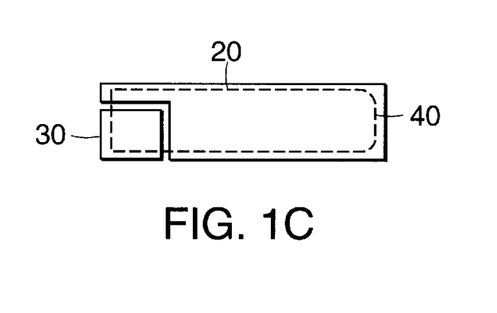
FIG. 1C is a diagrammatic top-down view of one embodiment of a rear-addressing electrode structure.

The electrodes 30, 40 should be sized and positioned appropriately so that together they address the entire capsule 20. There may be exactly one pair of electrodes 30, 40 per capsule 20, multiple pairs of electrodes 30, 40 per capsule 20, or a single pair of electrodes 30, 40 may span multiple capsules 20. In the embodiment shown in FIGS. 1A and 1B, the capsule 20 has a flattened, rectangular shape. In these embodiments, the electrodes 30, 40 should address most, or all, of the flattened surface area adjacent the electrodes 30, 40. The smaller electrode 30 is at most one-half the size of the larger electrode 40. In preferred embodiments the smaller electrode is one-quarter the size of the larger electrode 40; in more preferred embodiments the smaller electrode 30 is one-eighth the size of the larger electrode 40. In even more preferred embodiments, the smaller electrode 30 is one-sixteenth the size of the larger electrode 40. It should be noted that reference to "smaller" in connection with the electrode 30 means that the electrode 30 addresses a smaller amount of the surface area of the capsule 20, not necessarily that the electrode 30 is physically smaller than the larger electrode 40. For example, multiple capsules 20 may be positioned such that less of each capsule 20 is addressed by the "smaller" electrode 30, even though both electrodes 30, 40 are equal in size. It should also be noted that, as shown in FIG. 1C, electrode 30 may address only a small corner of a rectangular capsule 20 (shown in phantom view in FIG. 1C), requiring the larger electrode 40 to surround the smaller electrode 30 on two sides in order to properly address the capsule 20. Selection of the percentage volume of the particles 50 and the electrodes 30, 40 in this manner allow the encapsulated display media to be addressed as described below.

Electrodes may be fabricated from any material capable of conducting electricity so that electrode 30, 40 may apply an electric field to the capsule 20. As noted above, the rear-addressed embodiments depicted in FIGS. 1A and 1B allow the electrodes 30, 40 to be fabricated from opaque materials such as solder paste, copper, copper-clad polyimide, graphite inks, silver inks and other metal-containing conductive inks. Alternatively, electrodes may be fabricated using transparent materials such as indium tin oxide and conductive polymers such as polyaniline or polythiopenes. Electrodes 30, 40 may be provided with contrasting optical properties. In some embodiments, one of the electrodes has an optical property complementary to optical properties of the particles 50.

In one embodiment, the capsule 20 contains positively charged black particles 50, and a substantially clear suspending fluid 25. The first, smaller electrode 30 is colored black, and is smaller than the second electrode 40, which is colored white or is highly reflective. When the smaller, black electrode 30 is placed at a negative voltage potential relative to larger, white electrode 40, the positively-charged particles 50 migrate to the smaller, black electrode 30. The effect to a viewer of the capsule 20 located at position 10 is a mixture of the larger, white electrode 40 and the smaller, black electrode 30, creating an effect which is largely white. Referring to FIG. 1B, when the smaller, black electrode 30 is placed at a positive voltage potential relative to the larger, white electrode 40, particles 50 migrate to the larger, white electrode 40 and the viewer is presented a mixture of the black particles 50 covering the larger, white electrode 40 and the smaller, black electrode 30, creating an effect which is largely black. In this manner the capsule 20 may be addressed to display either a white visual state or a black visual state.

Other two-color schemes are easily provided by varying the color of the smaller electrode 30 and the particles 50 or by varying the color of the larger electrode 40. For example, varying the color of the larger electrode 40 allows fabrication of a rear-addressed, two-color display having black as one of the colors. Alternatively, varying the color of the smaller electrode 30 and the particles 50 allow a rear-addressed two-color system to be fabricated having white as one of the colors. Further, it is contemplated that the particles 50 and the smaller electrode 30 can be different colors. In these embodiments, a two-color display may be fabricated having a second color that is different from the color of the smaller electrode 30 and the particles 50. For example, a rear-addressed, orange-white display may be fabricated by providing blue particles 50, a red, smaller electrode 30, and a white (or highly reflective) larger electrode 40. In general, the optical properties of the electrodes 30, 40 and the particles 50 can be independently selected to provide desired display characteristics. In some embodiments the optical properties of the dispersing fluid 25 may also be varied, e.g. the fluid 25 may be dyed.

Figure 2A:
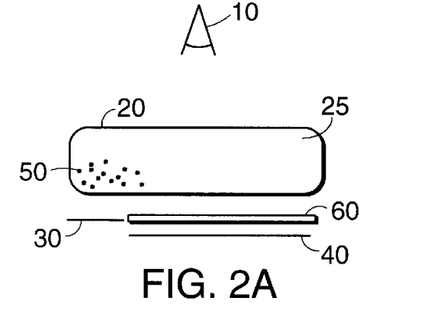
FIG. 2A is a diagrammatic side view of an embodiment of a rear-addressing electrode structure having a retroreflective layer associated with the larger electrode in which the smaller electrode has been placed at a voltage relative to the large electrode causing the particles to migrate to the smaller electrode.
Figure 2B:
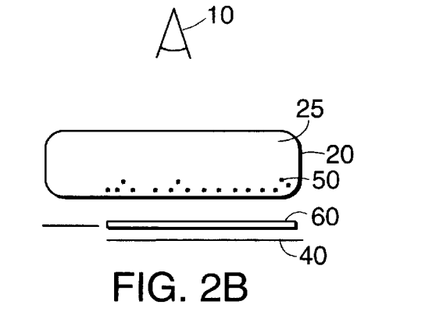
FIG. 2B is a diagrammatic side view of an embodiment of a rear-addressing electrode structure having a retroreflective layer associated with the larger electrode in which the larger electrode has been placed at a voltage relative to the smaller electrode causing the particles to migrate to the larger electrode.
Figure 2C:
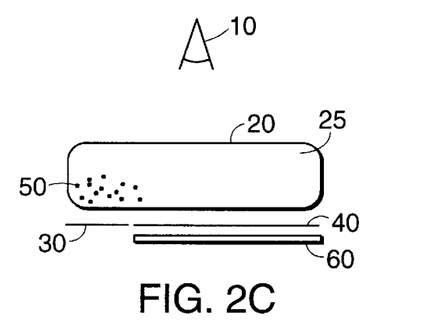
FIG. 2C is a diagrammatic side view of an embodiment of a rear-addressing electrode structure having a retroreflective layer disposed below the larger electrode in which the smaller electrode has been placed at a voltage relative to the large electrode causing the particles to migrate to the smaller electrode.
Figure 2D:
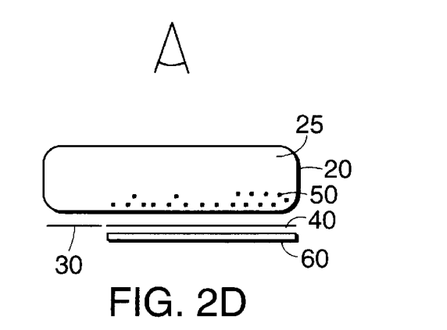
FIG. 2D is a diagrammatic side view of an embodiment of a rear-addressing electrode structure having a retroreflective layer disposed below the larger electrode in which the larger electrode has been placed at a voltage relative to the smaller electrode causing the particles to migrate to the larger electrode.

In other embodiments the larger electrode 40 may be reflective instead of white. In these embodiments, when the particles 50 are moved to the smaller electrode 30, light reflects off the reflective surface 60 associated with the larger electrode 40 and the capsule 20 appears light in color, e.g. white (see FIG. 2A). When the particles 50 are moved to the larger electrode 40, the reflecting surface 60 is obscured and the capsule 20 appears dark (see FIG. 2B) because light is absorbed by the particles 50 before reaching the reflecting surface 60. The reflecting surface 60 for the larger electrode 40 may possess retroreflective properties, specular reflection properties, diffuse reflective properties or gain reflection properties. In certain embodiments, the reflective surface 60 reflects light with a Lambertian distribution. The surface 60 may be provided as a plurality of glass spheres disposed on the electrode 40, a diffractive reflecting layer such as a holographically formed reflector, a surface patterned to totally internally reflect incident light, a brightness-enhancing film, a diffuse reflecting layer, an embossed plastic or metal film, or any other known reflecting surface. The reflecting surface 60 may be provided as a separate layer laminated onto the larger electrode 40 or the reflecting surface 60 may be provided as a unitary part of the larger electrode 40. In the embodiments depicted by FIGS. 2C and 2D, the reflecting surface may be disposed below the electrodes 30, 40 vis-à-vis the viewpoint 10. In these embodiments, electrode 30 should be transparent so that light may be reflected by surface 60. In other embodiments, proper switching of the particles may be accomplished with a combination of alternating-current (AC) and direct-current (DC) electric fields and described below in connection with FIGS. 3A–3D.

In still other embodiments, the rear-addressed display previously discussed can be configured to transition between largely transmissive and largely opaque modes of operation (referred to hereafter as "shutter mode"). Referring back to FIGS. 1A and 1B, in these embodiments the capsule 20 contains at least one positively-charged particle 50 dispersed in a substantially clear dispersing fluid 25. The larger electrode 40 is transparent and the smaller electrode 30 is opaque. When the smaller, opaque electrode 30 is placed at a negative voltage potential relative to the larger, transmissive electrode 40, the particles 50 migrate to the smaller, opaque electrode 30. The effect to a viewer of the capsule 20 located at position 10 is a mixture of the larger, transparent electrode 40 and the smaller, opaque electrode 30, creating an effect which is largely transparent. Referring to FIG. 1B, when the smaller, opaque electrode 30 is placed at a positive voltage potential relative to the larger, transparent electrode 40, particles 50 migrate to the second electrode 40 and the viewer is presented a mixture of the opaque particles 50 covering the larger, transparent electrode 40 and the smaller, opaque electrode 30, creating an effect which is largely opaque. In this manner, a display formed using the capsules depicted in FIGS. 1A and 1B may be switched between transmissive and opaque modes. Such a display can be used to construct a window that can be rendered opaque. Although FIGS. 1A–2D depict a pair of electrodes associated with each capsule 20, it should be understood that each pair of electrodes may be associated with more than one capsule 20.

Figure 3A:
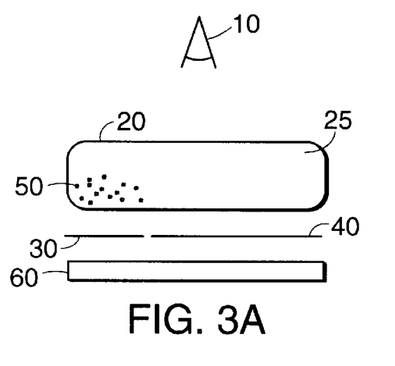
FIG. 3A is a diagrammatic side view of an embodiment of an addressing structure in which a direct-current electric field has been applied to the capsule causing the particles to migrate to the smaller electrode.

A similar technique may be used in connection with the embodiment of FIGS. 3A, 3B, 3C, and 3D. Referring to FIG. 3A, a capsule 20 contains at least one dark or black particle 50 dispersed in a substantially clear dispersing fluid 25. A smaller, opaque electrode 30 and a larger, transparent electrode 40 apply both direct-current (DC) electric fields and alternating-current (AC) fields to the capsule 20. A DC field can be applied to the capsule 20 to cause the particles 50 to migrate towards the smaller electrode 30. For example, if the particles 50 are positively charged, the smaller electrode is placed a voltage that is more negative than the larger electrode 40. Although FIGS. 3A–3D depict only one capsule per electrode pair, multiple capsules may be addressed using the same electrode pair.

The smaller electrode 30 is at most one-half the size of the larger electrode 40. In preferred embodiments the smaller electrode is one-quarter the size of the larger electrode 40; in more preferred embodiments the smaller electrode 30 is one-eighth the size of the larger electrode 40. In even more preferred embodiments, the smaller electrode 30 is one-sixteenth the size of the larger electrode 40.

Causing the particles 50 to migrate to the smaller electrode 30, as depicted in FIG. 3A, allows incident light to pass through the larger, transparent electrode 40 and be reflected by a reflecting surface 60. In shutter mode, the reflecting surface 60 is replaced by a translucent layer, a transparent layer, or a layer is not provided at all, and incident light is allowed to pass through the capsule 20, i.e. the capsule 20 is transmissive.

Figure 3B:
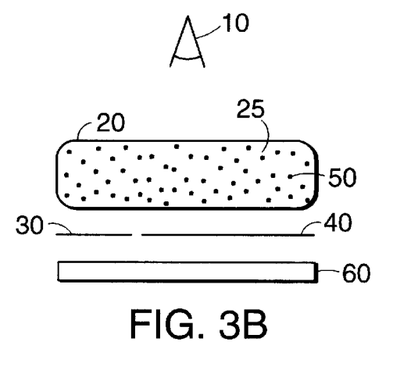
FIG. 3B is a diagrammatic side view of an embodiment of an addressing structure in which an alternating-current electric field has been applied to the capsule causing the particles to disperse into the capsule.

Referring now to FIG. 3B, the particles 50 are dispersed into the capsule 20 by applying an AC field to the capsule 20 via the electrodes 30, 40. The particles 50, dispersed into the capsule 20 by the AC field, block incident light from passing through the capsule 20, causing it to appear dark at the viewpoint 10. The embodiment depicted in FIGS. 3A–3B may be used in shutter mode by not providing the reflecting surface 60 and instead providing a translucent layer, a transparent layer, or no layer at all. In shutter mode, application of an AC electric field causes the capsule 20 to appear opaque. The transparency of a shutter mode display formed by the apparatus depicted in FIGS. 3A–3D may be controlled by the number of capsules addressed using DC fields and AC fields. For example, a display in which every other capsule 20 is addressed using an AC field would appear fifty percent transmissive.

Figure 3C:
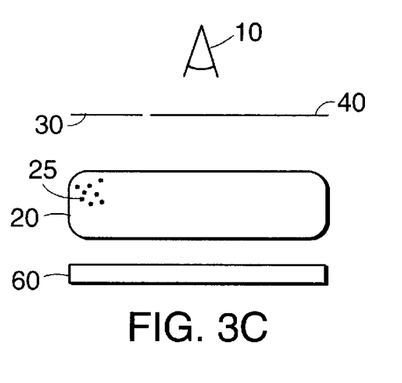
FIG. 3C is a diagrammatic side view of an embodiment of an addressing structure having transparent electrodes, in which a direct-current electric field has been applied to the capsule causing the particles to migrate to the smaller electrode.
Figure 3D:
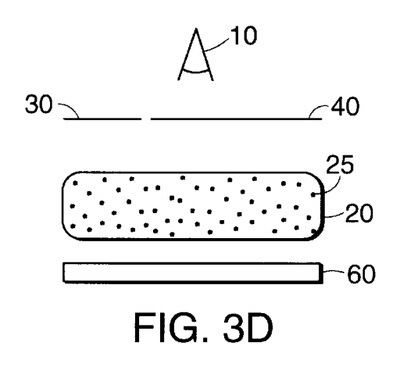
FIG. 3D is a diagrammatic side view of an embodiment of an addressing structure having transparent electrodes, in which an alternating-current electric field has been applied to the capsule causing the particles to disperse into the capsule.

FIGS. 3C and 3D depict an embodiment of the electrode structure described above in which electrodes 30, 40 are on "top" of the capsule 20, that is, the electrodes 30, 40 are between the viewpoint 10 and the capsule 20. In these embodiments, both electrodes 30, 40 should be transparent. Transparent polymers can be fabricated using conductive polymers, such as polyaniline, polythiophenes, or indium tin oxide. These materials may be made soluble so that electrodes can be fabricated using coating techniques such as spin coating, spray coating, meniscus coating, printing techniques, forward and reverse roll coating and the like. In these embodiments, light passes through the electrodes 30, 40 and is either absorbed by the particles 50, reflected by retroreflecting layer 60 (when provided), or transmitted throughout the capsule 20 (when retroreflecting layer 60 is not provided).

The addressing structure depicted in FIGS. 3A–3D may be used with electrophoretic display media and encapsulated electrophoretic display media. FIGS. 3A–3D depict embodiments in which electrode 30, 40 are statically attached to the display media. In certain embodiments, the particles 50 exhibit bistability, that is, they are substantially motionless in the absence of a electric field. In these embodiments, the electrodes 30, 40 may be provided as part of a "stylus" or other device which is scanned over the material to address each capsule or cluster of capsules.

Figure 4A:
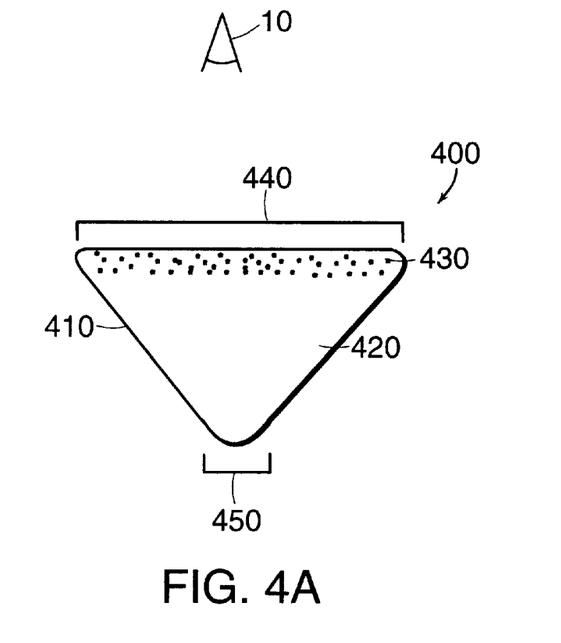
FIG. 4A is a diagrammatic cross-sectional view of a shutter mode display element in a light-blocking configuration.

FIG. 4A depicts a cross-sectional side view of an embodiment of a shutter mode electrophoretic display element 400 in its light-blocking configuration. The element comprises a microcapsule 410, which contains a suspending fluid 420 and at least one particle 430. The microcapsule 410 has a first, larger surface 440 and a second, smaller surface 450. The microcapsule is subjected to a first electric field of such an orientation and strength that the particles 430 migrate towards the larger surface 440, substantially blocking light from passing through the microcapsule 410 when the particles 430 are substantially opaque. For example, if the particles 430 have positive charge, the particles will migrate towards the larger surface 440 when an electric field having an electric vector with a positive gradient extending substantially from the larger surface 440 to the smaller surface 450 is applied, that is, an electric field is applied which has a more negative voltage at the larger surface 440 and a more positive voltage at the smaller surface 450. In this embodiment, the element would appear to a viewer 10 to have the optical property or properties of the particles 430. In another embodiment, the particles 430 may be colored. In this embodiment, the electrophoretic display element 400 exhibit the color of the particles 430. In another embodiment, the particles 430 are reflective, and the electrophoretic display element 400 will appear reflective. It will be apparent to those of ordinary skill in the art that the visual appearance of the electrophoretic display element 400 may be varied by selecting the visual appearance of the particles 430 appropriately.

In one embodiment, the electrophoretic display element 400 has a substantially triangular cross section, as depicted in FIG. 4A. An electrophoretic display element 400 having such a cross section may be substantially conical or substantially pyramidal in shape. In another embodiment, the electrophoretic display element 400 may have a substantially trapezoidal cross-section. In yet another embodiment, the electrophoretic display element 400 may have a substantially rectangular cross section. In further embodiments, the electrophoretic display element 400 can have a shape which is not regular, provided that the second surface 450 is smaller than the first surface 440. In yet another embodiment, the electrophoretic display element 400 can have a shape in which the physical sizes of the first surface 440 and the second surface 450 are equal, but the first surface 440 and the second surface 450 are situated in a relatively oblique configuration such that the projected area of the second surface 450 is smaller than the projected area of the first surface 440 when viewed in the intended viewing direction. In different embodiments, the shape of electrophoretic display element 400 can be polygonal when viewed in the intended viewing direction, with 3 to 12 sides. The polygon can be regular, that is, a polygon of N (where N ranges from 3 to 12) sides inscribed within a circle. In other embodiments, the polygon can be a polygon of N (where N ranges from 3 to 12) sides.

Figure 4B:
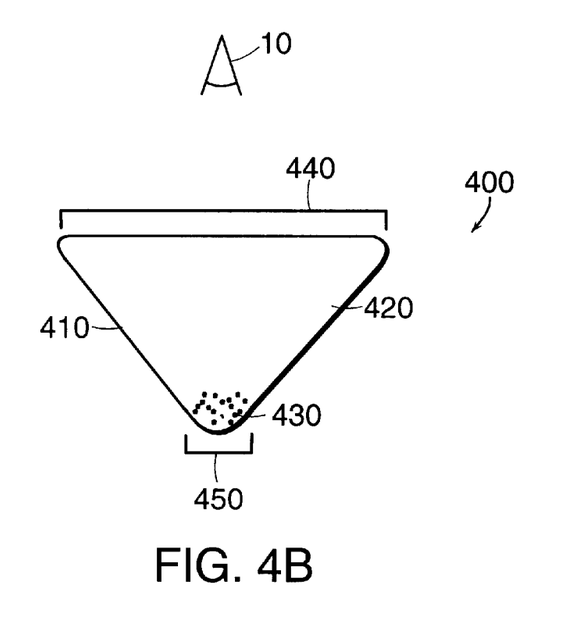
FIG. 4B is a diagrammatic cross-sectional view of a shutter mode display element in a light-passing configuration.

FIG. 4B depicts a cross-sectional side view of an embodiment of a shutter mode electrophoretic display element 400 in its light-passing configuration. The element comprises a microcapsule 410, which contains a suspending fluid 420 and at least one particle 430. The microcapsule has a first, larger surface 440 and a second, smaller surface 450. The microcapsule is subjected to a second electric field of such an orientation and strength that the particles 430 migrates towards the smaller surface 450, allowing light to pass through the microcapsule 410 because the particles are concentrated in a vary small area of the microcapsule. The element 410 would appear to a viewer 10 to have the optical property or properties of the suspending fluid 420. In one embodiment, the suspending fluid 420 is clear, and the electrophoretic display element 400 will appear substantially transparent. In another embodiment, the suspending fluid 420 may be dyed or may inherently be colored, and the electrophoretic display element 400 will present to the viewer 10 the color of the fluid 420. In another embodiment, an electrode may be provided behind the electrophoretic display element 400 that is colored, or a substrate may be present having a color. In these embodiments, the electrophoretic display element 400 will present a visual appearance that is a function of both the optical characteristic of the electrode or substrate and the suspending fluid 420.

The second, smaller surface 450 may be 90% of the area of the first larger surface 440. In another embodiment the area of the second, smaller surface 450 may be 80% of the area of the first larger surface 440. In yet another embodiment the area of the second, smaller surface 450 may be 70% of the area of the first larger surface 440. In still another embodiment the area of the second, smaller surface 450 may be 60% of the area of the first larger surface 440. In a further embodiment the area of the second, smaller surface 450 may be 50% of the area of the first larger surface 440. In yet a further embodiment the area of the second, smaller surface 450 may be 25% of the area of the first larger surface 440. In a still further embodiment the area of the second, smaller surface 450 may be 12.5% of the area of the first larger surface 440. In another embodiment the area of the second, smaller surface 450 may be 1/16th of the area of the first larger surface 440.

Figure 4C:
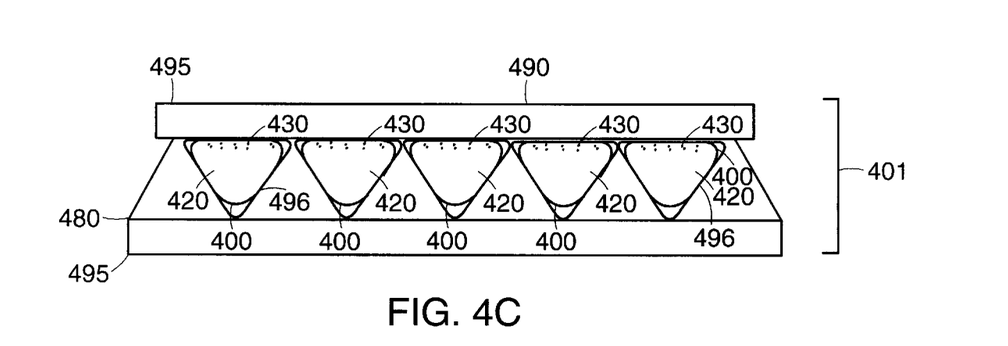
FIG. 4C is a diagrammatic side view of a display formed of multiple shutter mode display elements.

FIG. 4C depicts a side view of an embodiment of a plurality of shutter mode electrophoretic display elements, generally 400, which have been arranged as an electrophoretic display 401. The electrophoretic display elements 400 are controlled as described above in connection with FIGS. 4A and 4B. The electrophoretic display 401 can be created by providing a first substrate 480 that forms a number of cavities. In the embodiment depicted in FIG. 4C, each cavity has a triangular cross-section in the substrate, such as a conical depression, a pyramidal depression or a groove having a triangular cross section. In another embodiment the cavities may have rectangular cross sections. A second substrate 490 may be attached to the first substrate to close each of the cavities. Electrodes 495 may be disposed adjacent the substrates to apply an electric field to the display elements 400. In another embodiment, electrodes 496 may be disposed on at least a part of the surface of the first substrate 480 that defines the cavities, so that an electric field can be applied to the display elements 400 in an orientation which is oblique, rather than perpendicular, to the surface of the first substrate 480.

The first substrate 480 can provide cavities having trapezoidal, circular, conic, hemispheric, or rectangular cross-sections. In other embodiments, the first substrate 480 provides cavities having cross-sections that are not geometrically regular. Alternatively, the first substrate 480 may provide a substantially planar surfaces defining a trough having a triangular cross section. Alternatively, the trough can be substantially straight, curvilinear (such as a spiral), a series of concentric circular troughs, or grooves having substantially parallel sides. As can be appreciated by those of ordinary skill in the art, many different shapes of cavities may be used with success. The cavities may be provided in a regular arrangement, such as a rectangular grid, or the cavities may be irregularly spaced.

In one embodiment, the first substrate 480 is substantially clear. In this embodiment, the electrophoretic display 401 is substantially transparent when the display elements 400 are in the light-passing configuration. The display 401 will have the optical characteristics of the plurality of particles 430 when the display elements 400 are in the light-blocking configuration. Alternatively, the first substrate 480 can be colored. In this embodiment, the electrophoretic display 401 will appear substantially colored when the display elements 400 are in the light passing configuration. The display 401 will have substantially the optical characteristics of the plurality of particles 430 when the display elements 400 are in the light-blocking configuration. In another embodiment, the suspending fluid 420 can be colored, and the electrophoretic display 401 will have the same color as the suspending fluid 420 when the display elements 400 are in the light passing configuration. The display 401 will have substantially the optical characteristics of the plurality of particles 430 when the display elements 400 are in the light-blocking configuration. The first substrate 480 can be patterned by etching, by micromachining, or by embossing using a suitable embossing die or by other pressure or thermal processes.

Figure 5A:
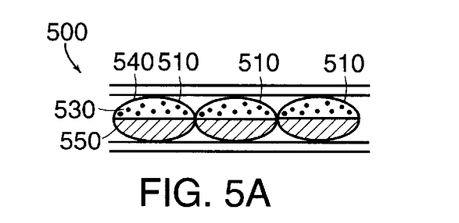
FIG. 5A is a diagrammatic cross-sectional view of a display formed of multiple shutter mode display elements containing a suspending fluid, at least one particle, and a structural material.
Figure 5B:
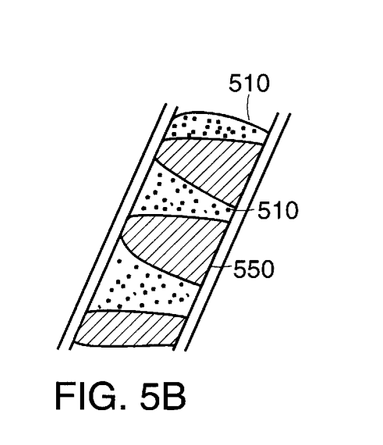
FIG. 5B is a diagrammatic cross-sectional view of the display of FIG. 5A oriented at a predetermined angle.
Figure 5C:
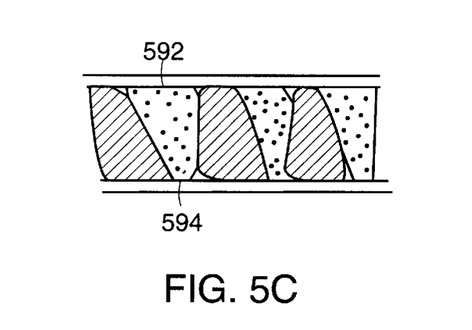
FIG. 5C is a diagrammatic cross-sectional view of the display of FIG. 5A after the structural material has been cured.

FIGS. 5A–5C depict in side view an embodiment of a shutter mode electrophoretic display 500 constructed using a curable polymer. FIG. 5A depicts a shutter mode electrophoretic display 500, containing an assemblage of display elements, generally 5 10, in side view. Each display element 510 contains at least one particle 530, a suspending fluid 540, and a quantity of an uncured polymer 550. The suspending fluid 540 and the polymer 550 are selected at least in part based on a difference in density, such that there is a tendency to form two separate liquids when the polymer 550 is uncured. Alternatively, the fluids can have a difference in dielectric constant, and be migrated to different regions with electric fields. In alternative embodiments, uncured polymer 550 can be a radiation or thermally cured urethane, urethane/acrylate, silicone, epoxy, or acrylate.

Organic solvents, such as halogenated organic solvents, saturated linear or branched hydrocarbons, silicone oils, and low molecular weight halogen-containing polymers are some useful suspending fluids. The suspending fluid may comprise a single fluid. The fluid will, however, often be a blend of more than one fluid in order to tune its chemical and physical properties. Furthermore, the fluid may contain surface modifiers to modify the surface energy or charge of the electrophoretic particle or bounding capsule. Reactants or solvents for the microencapsulation process (oil soluble monomers, for example) can also be contained in the suspending fluid. Charge control agents can also be added to the suspending fluid. Useful organic solvents include, but are not limited to, epoxides, such as, for example, decane epoxide and dodecane epoxide; vinyl ethers, such as, for example, cyclohexyl vinyl ether and Decave® (International Flavors & Fragrances, Inc., New York, N.Y.); and aromatic hydrocarbons, such as, for example, toluene and naphthalene. Useful halogenated organic solvents include, but are not limited to, tetrafluorodibromoethylene, tetrachloroethylene, trifluorochloroethylene, 1,2,4-trichlorobenzene, carbon tetrachloride. These materials have high densities. Useful hydrocarbons include, but are not limited to, dodecane, tetradecane, the aliphatic hydrocarbons in the Isopar® series (Exxon, Houston, Tex.), Norpar® (series of normal paraffinic liquids), Shell-Sol® (Shell, Houston, Tex.), and Sol-Trol® (Shell), naphtha, and other petroleum solvents. These materials usually have low densities. Useful examples of silicone oils include, but are not limited to, octamethyl cyclosiloxane and higher molecular weight cyclic siloxanes, poly (methyl phenyl siloxane), hexamethyldisiloxane, and polydimethylsiloxane. These materials usually have low densities. Useful low molecular weight halogen-containing polymers include, but are not limited to, poly(chlorotrifluoroethylene) polymer (Halogenated hydrocarbon Inc., River Edge, N.J.), Galden® (a perfluorinated ether from Ausimont, Morristown, N.J.), or Krytox® from Dupont (Wilmington, Del.). In a preferred embodiment, the suspending fluid is a poly (chlorotrifluoroethylene) polymer. In a particularly preferred embodiment, this polymer has a degree of polymerization from about 2 to about 10. Many of the above materials are available in a range of viscosities, densities, and boiling points.

FIG. 5B, shows the display 500 tipped at a selected angle, so that the uncured polymer 550 assumes a position such that it has a free surface (i.e, a surface not in contact with the microcapsule 520) which forms an angle with respect to an axis perpendicular to the display element 510. In the embodiment depicted, the polymer 550 is more dense than the suspending fluid 540. In another embodiment, the density of the liquid polymer 550 is less than that of the suspending fluid 540, and the liquid polymer 550 would float on the suspending fluid 540. The polymer 550 is then cured, that is, it is hardened by the action of light or heat, so that at least its free surface becomes rigid. Fluorescent light, ultraviolet light, electron beams, or other radiation sources may be used to cure the polymer 530. Alternatively, the polymer 530 may be cured by heat. In these embodiments, heat may be applied by microwave, thermal pulse, or heat lamp. It is possible to orient the display 500, cure the polymer 550 in a first capsule 510, reorient the display 500 to another angular position, and cure the polymer 550 contained in a second capsule 510, in order to create a plurality of elements having cured polymer with different angular orientations in different microcapsules. FIG. 5C depicts a display 500 in which the polymer 550 has been cured to form display elements 510 having a first, larger surface 592, and a second, smaller surface 594.

Figure 6A:
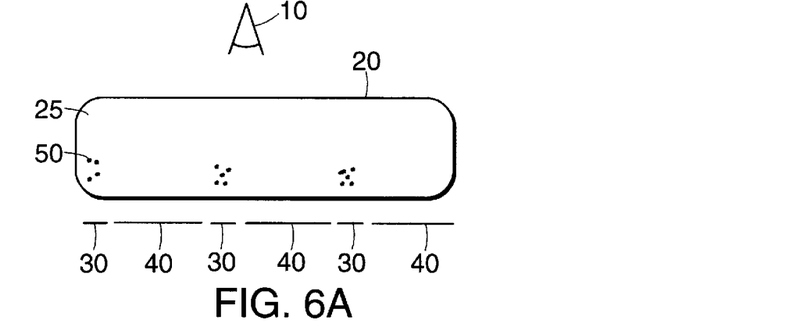
FIG. 6A is a diagrammatic side view of an embodiment of a rear-addressing electrode structure for a particle-based display in which multiple smaller electrodes have been placed at a voltage relative to multiple larger electrodes, causing the particles to migrate to the smaller electrodes.
Figure 6B:
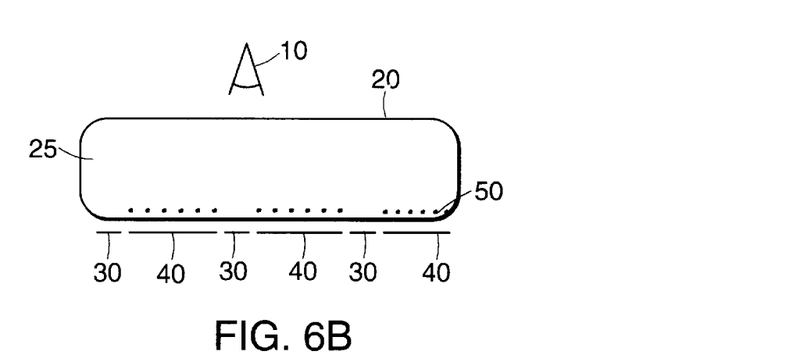
FIG. 6B is a diagrammatic side view of an embodiment of a rear-addressing electrode structure for a particle-based display in which multiple larger electrodes have been placed at a voltage relative to multiple smaller electrodes, causing the particles to migrate to the larger electrodes.

Referring now to FIGS. 6A and 6B, a capsule 20 of an electronically addressable media is illustrated in which the technique illustrated above is used with multiple rear-addressing electrodes. The capsule 20 contains at least one particle 50 dispersed in a clear suspending fluid 25. The capsule 20 is addressed by multiple smaller electrodes 30 and multiple larger electrodes 40. In these embodiments, the smaller electrodes 30 should be selected to collectively be at most one-half the size of the larger electrodes 40. In further embodiments, the smaller electrodes 30 are collectively one-fourth the size of the larger electrodes 40. In further embodiments the smaller electrodes 30 are collectively one-eighth the size of the larger electrodes 40. In preferred embodiments, the smaller electrodes 30 are collectively one-sixteenth the size of the larger electrodes 40. Each electrode 30 may be provided as separate electrodes that are controlled in parallel to control the display. For example, each separate electrode may be substantially simultaneously set to the same voltage as all other electrodes of that size. Alternatively, the electrodes 30, 40 may be interdigitated to provide the embodiment shown in FIGS. 6A and 6B.

Operation of the rear-addressing electrode structure depicted in FIGS. 6A and 6B is similar to that described above. For example, the capsule 20 may contain positively charged, black particles 50 dispersed in a substantially clear suspending fluid 25. The smaller electrodes 30 are colored black and the larger electrodes 40 are colored white or are highly reflective. Referring to FIG. 6A, the smaller electrodes 30 are placed at a negative potential relative to the larger electrodes 40, causing particles 50 migrate within the capsule to the smaller electrodes 30 and the capsule 20 appears to the viewpoint 10 as a mix of the larger, white electrodes 40 and the smaller, black electrodes 30, creating an effect which is largely white. Referring to FIG. 6B, when the smaller electrodes 30 are placed at a positive potential relative to the larger electrodes 40, particles 50 migrate to the larger electrodes 40 causing the capsule 20 to display a mix of the larger, white electrodes 40 occluded by the black particles 50 and the smaller, black electrodes 30, creating an effect which is largely black. The techniques described above with respect to the embodiments depicted in FIGs. 1A and 1B for producing two-color displays work with equal effectiveness in connection with these embodiments.

Figure 7A:
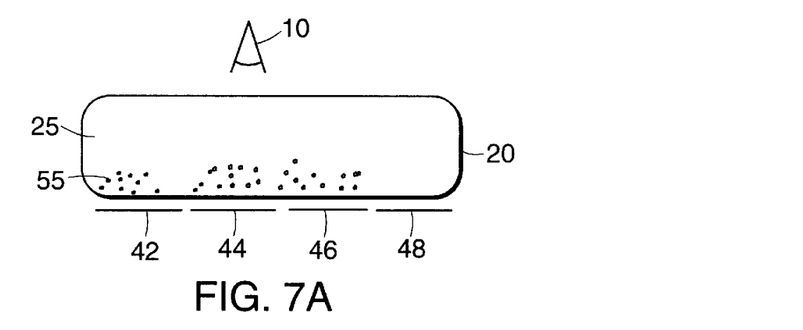
FIG. 7A is a diagrammatic side view of an embodiment of a rear-addressing electrode structure for a particle-based display having colored electrodes and a white electrode, in which the colored electrodes have been placed at a voltage relative to the white electrode causing the particles to migrate to the colored electrodes.
Figure 7B:
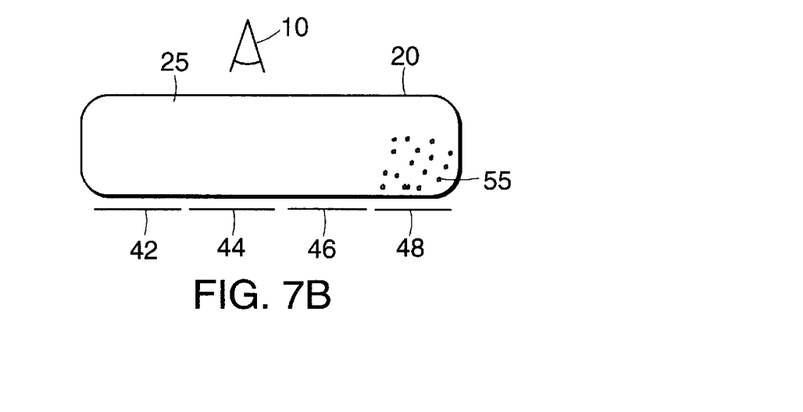
FIG. 7B is a diagrammatic side view of an embodiment of a rear-addressing electrode structure for a particle-based display having colored electrodes and a white electrode, in which the white electrode has been placed at a voltage relative to the colored electrodes causing the particles to migrate to the white electrode.

FIGS. 7A and 7B depict an embodiment of a rear-addressing electrode structure that creates a reflective color display in a manner similar to halftoning or pointillism. The capsule 20 contains white particles 55 dispersed in a clear suspending fluid 25. Electrodes 42, 44, 46, 48 are colored cyan, magenta, yellow, and white respectively. Referring to FIG. 7A, when the colored electrodes 42, 44, 46 are placed at a positive potential relative to the white electrode 48, negatively-charged particles 55 migrate to these three electrodes, causing the capsule 20 to present to the viewpoint 10 a mix of the white particles 55 and the white electrode 48, creating an effect which is largely white. Referring to FIG. 7B, when electrodes 42, 44, 46 are placed at a negative potential relative to electrode 48, particles 55 migrate to the white electrode 48, and the eye 10 sees a mix of the white particles 55, the cyan electrode 42, the magenta electrode 44, and the yellow electrode 46, creating an effect which is largely black or gray. By addressing the electrodes, any color can be produced that is possible with a subtractive color process. For example, to cause the capsule 20 to display an orange color to the viewpoint 10, the yellow electrode 46 and the magenta electrode 42 are set to a voltage potential that is more positive than the voltage potential applied by the cyan electrode 42 and the white electrode 48. Further, the relative intensities of these colors can be controlled by the actual voltage potentials applied to the electrodes. In another embodiment, the particles 55 can be reflective or absorbing. In yet another embodiment, electrodes 42, 44, 46, 48 can be red, green, blue and white, respectively. In yet another embodiment, the particles 55 can be black and electrode 48 can be black.

Figure 8:
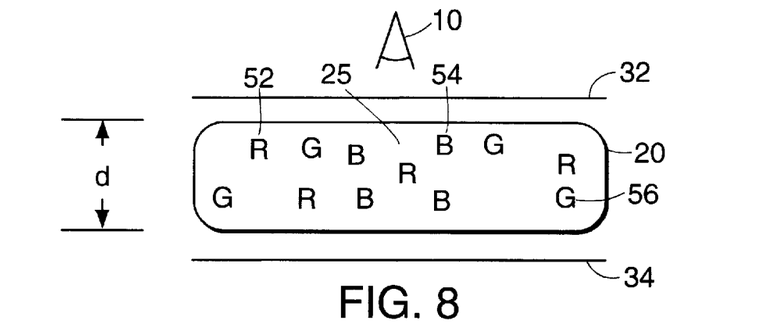
FIG. 8 is a diagrammatic side view of an embodiment of a color display element having red, green, and blue particles of different electrophoretic mobilities.

In another embodiment, depicted in FIG. 8, a color display is provided by a capsule 20 of size d containing multiple species of particles in a clear, dispersing fluid 25. Each species of particles has different optical properties and possess different electrophoretic mobilities ($\mu$) from the other species. In the embodiment depicted in FIG. 8, the capsule 20 contains red particles 52, blue particles 54, and green particles 56, and $|\mu_R|>|\mu_B|>|\mu_G|$ That is, the magnitude of the electrophoretic mobility of the red particles 52, on average, exceeds the electrophoretic mobility of the blue particles 54, on average, and the electrophoretic mobility of the blue particles 54, on average, exceeds the average electrophoretic mobility of the green particles 56. As an example, there may be a species of red particle with a zeta potential of 100 millivolts (mV), a blue particle with a zeta potential of 60 mV, and a green particle with a zeta potential of 20 mV. The capsule 20 is placed between two electrodes 32, 42 that apply an electric field to the capsule.

Figure 9A:
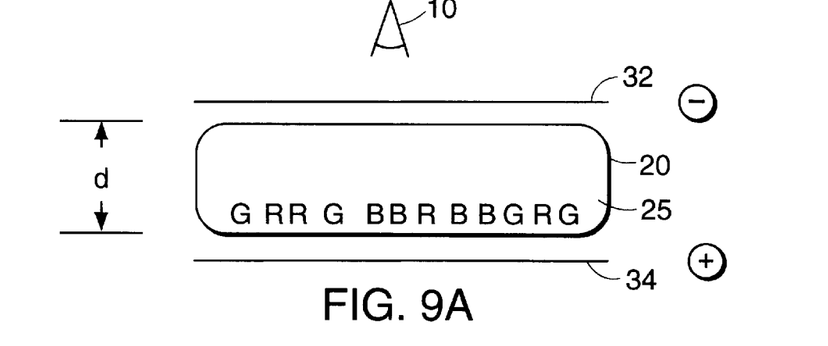
FIGS. 9A–9B depict the steps taken to address the display of FIG. 6 to display red.
Figure 9B:
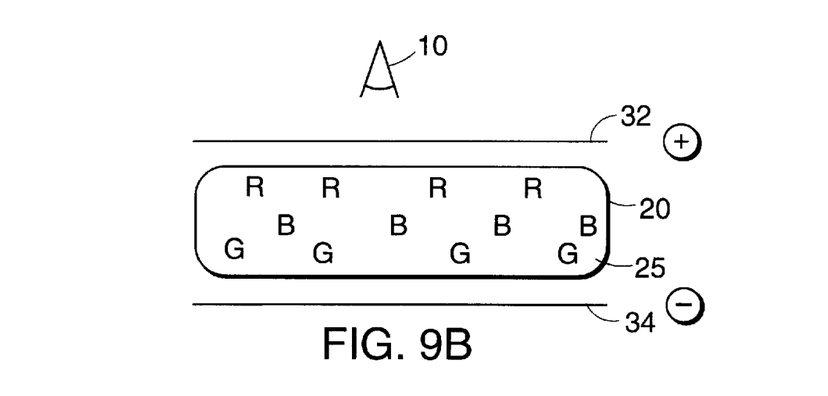

FIGS. 9A–9B depict the steps to be taken to address the display shown in FIG. 8 to display a red color to a viewpoint 10. Referring to FIG. 9A, all the particles 52, 54, 56 are attracted to one side of the capsule 20 by applying an electric field in one direction. The electric field should be applied to the capsule 20 long enough to attract even the more slowly moving green particles 56 to the electrode 34. Referring to FIG. 9B, the electric field is reversed just long enough to allow the red particles 52 to migrate towards the electrode 32. The blue particles 54 and green particles 56 will also move in the reversed electric field, but they will not move as fast as the red particles 52 and thus will be obscured by the red particles 52. The amount of time for which the applied electric field must be reversed can be determined from the relative electrophoretic mobilities of the particles, the strength of the applied electric field, and the size of the capsule.

Figure 10A:
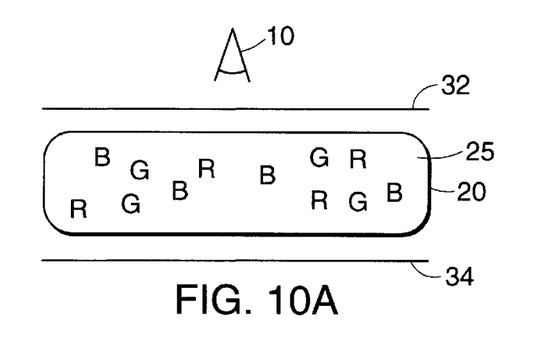
FIGS. 10A–10D depict the steps taken to address the display of FIG. 8 to display blue.
Figure 10B:
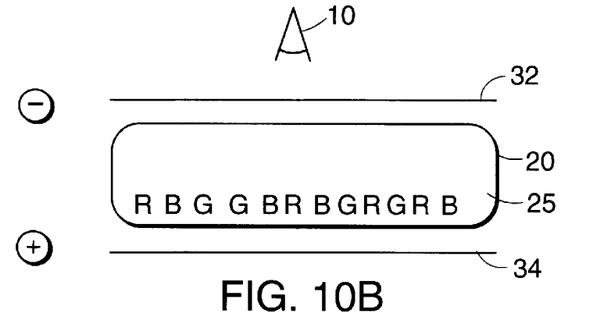
Figure 10C:
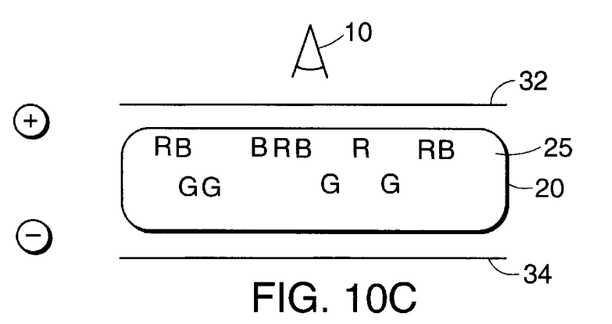
Figure 10D:
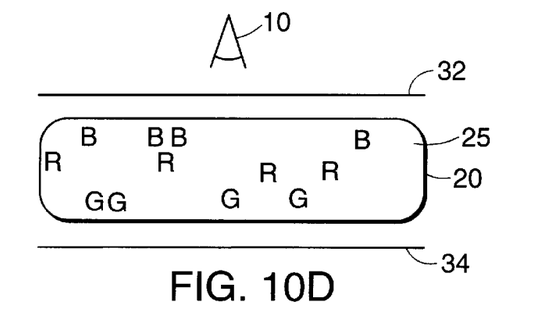

FIGS. 10A–10d depict addressing the display element to a blue state. As shown in FIG. 10A, the particles 52, 54, 56 are initially randomly dispersed in the capsule 20. All the particles 52, 54, 56 are attracted to one side of the capsule 20 by applying an electric field in one direction (shown in FIG. 10B). Referring to FIG. 10C, the electric field is reversed just long enough to allow the red particles 52 and blue particles 54 to migrate towards the electrode 32. The amount of time for which the applied electric field must be reversed can be determined from the relative electrophoretic mobilities of the particles, the strength of the applied electric field, and the size of the capsule. Referring to FIG. 10D, the electric field is then reversed a second time and the red particles 52, moving faster than the blue particles 54, leave the blue particles 54 exposed to the viewpoint 10. The amount of time for which the applied electric field must be reversed can be determined from the relative electrophoretic mobilities of the particles, the strength of the applied electric field, and the size of the capsule.

Figure 11A:
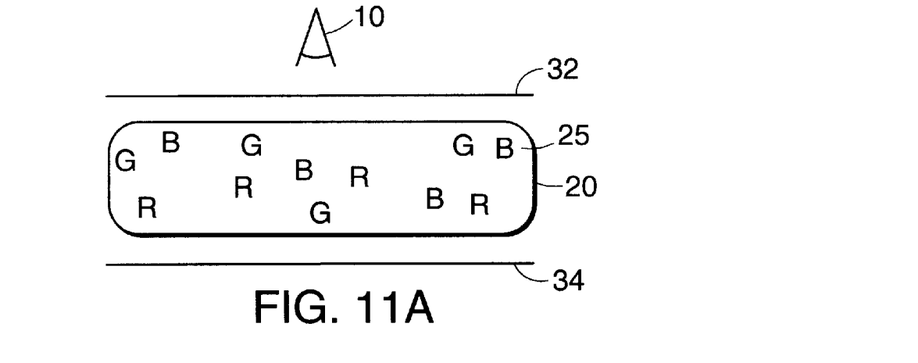
FIGS. 11A–11C depict the steps taken to address the display of FIG. 8 to display green.
Figure 11B:
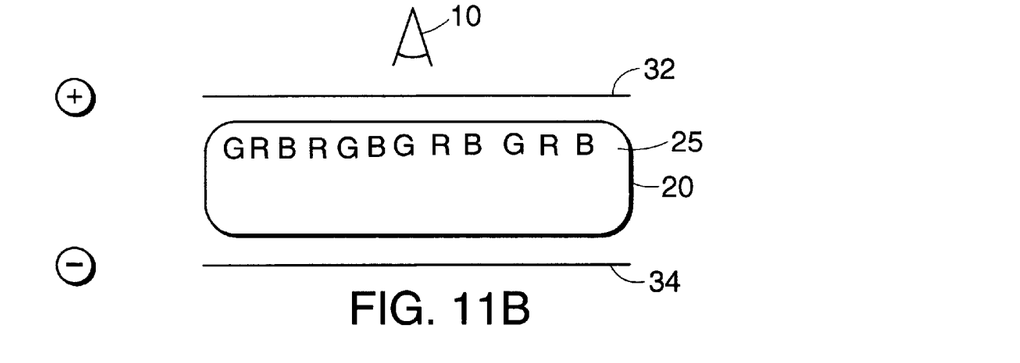
Figure 11C:
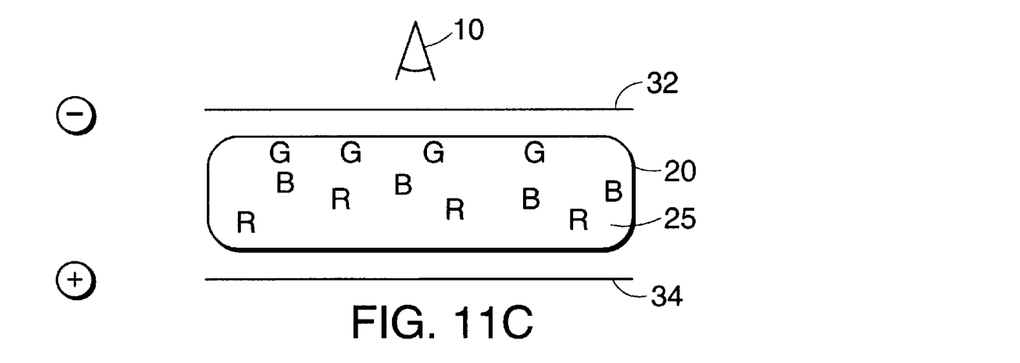

FIGS. 11A–11C depict the steps to be taken to present a green display to the viewpoint 10. As shown in FIG. 11A, the particles 52, 54, 56 are initially distributed randomly in the capsule 20. All the particles 52, 54, 56 are attracted to the side of the capsule 20 proximal the viewpoint 10 by applying an electric field in one direction. The electric field should be applied to the capsule 20 long enough to attract even the more slowly moving green particles 56 to the electrode 32. As shown in FIG. 11C, the electric field is reversed just long enough to allow the red particles 52 and the blue particles 54 to migrate towards the electrode 54, leaving the slowly-moving green particles 56 displayed to the viewpoint. The amount of time for which the applied electric field must be reversed can be determined from the relative electrophoretic mobilities of the particles, the strength of the applied electric field, and the size of the capsule.

In other embodiments, the capsule contains multiple species of particles and a dyed dispersing fluid that acts as one of the colors. In still other embodiments, more than three species of particles may be provided having additional colors. Although FIGS. 8–11C depict two electrodes associated with a single capsule, the electrodes may address multiple capsules or less than a full capsule.

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. An electrophoretic display element comprising:

a deformable capsule having a first surface and a second surface, said first surface having a larger projected surface area than a projected surface area of said second surface when both surfaces are viewed in an intended viewing direction;

said capsule containing:
 a suspending fluid; and
 at least one particle dispersed within said suspending fluid;

wherein application of a first electrical field causes the at least one particle to migrate towards said first surface and application of a second electrical field causes the at least one particle to migrate towards said surface.

2. The display element of claim 1 wherein the at least one particle has an optical property such that said display element is substantially opaque when the at least one particle migrates towards said first surface.

3. The display element of claim 1 wherein said display element is substantially transparent when the at least one particle migrates towards said second surface.

4. A method of manufacturing an electrophoretic display element comprising the steps of:

encapsulating with a capsule a suspending fluid having a first optical property, and at least one particle dispersed within said suspending fluid and having a second optical property different from said first optical property to produce a deformable capsule; and shaping said capsule to produce a first surface and a second surface, said first surface having a larger projected surface area than a projected surface area of said second surface when both surfaces are viewed in an intended viewing direction.

5. The method of claim 4 comprising the additional step of providing electrodes adapted to address said display element.

6. An electrophoretic display element comprising:

a deformable capsule having a first surface and a second surface, wherein said first surface and said second surface comprise different projected areas when viewed in the intended viewing direction;

said capsule containing:
 a suspending fluid; and
 at least one particle dispersed within said suspending fluid;

wherein application of a first electrical field causes the at least one particle to migrate towards said first surface and application of a second electrical field causes the at least to migrate towards said second surface.

7. The display element of claim 6 wherein said first surface and said second surface are substantially parallel.

* * * * *